United States Patent [19]

Fujita

[11] Patent Number: 5,191,288
[45] Date of Patent: Mar. 2, 1993

[54] COIL FOR GENERATING GRADIENT MAGNETIC FIELD

[75] Inventor: Michiru Fujita, Kawasaki, Japan

[73] Assignee: Fuji Electric Co., Ltd., Kawasaki, Japan

[21] Appl. No.: 721,701

[22] Filed: Jun. 26, 1991

[30] Foreign Application Priority Data

Jun. 29, 1990 [JP] Japan .................................. 2-171863

[51] Int. Cl.⁵ ............................................ G01R 33/20
[52] U.S. Cl. ....................................... 324/318; 324/304
[58] Field of Search ............... 324/300, 307, 309, 318, 324/322, 304, 316; 128/653.5

[56] References Cited

U.S. PATENT DOCUMENTS

| | | | |
|---|---|---|---|
| 3,778,700 | 12/1973 | Bayley et al. | 324/304 |
| 4,399,406 | 8/1983 | Biehl et al. | 324/316 |
| 4,403,190 | 9/1983 | Greenwood | 324/304 |
| 4,406,986 | 9/1983 | Greenwood | 324/304 |
| 4,845,432 | 7/1989 | Overweg | 324/318 |

FOREIGN PATENT DOCUMENTS 62-229808 10/1987 Japan .
63-147450 6/1988 Japan .

Primary Examiner—Michael J. Tokar
Attorney, Agent, or Firm—Spencer, Frank & Schneider

[57] ABSTRACT

A gradient magnetic field coil for generating a gradient magnetic field comprises at least one pair of conductive thin plates placed on a surface of a cylinder and rod conductors for supplying an electric current to at least one pair of conductive thin plates. In case of defining a body center of the cylinder to be an origin, defining a central axis of the cylinder to be a z axis, defining an axis included in the plane, intersecting at the origin and being vertical to the z axis to be an x axis and defining an axis intersecting at the origin and being vertical to the x axis and the z axis to be a y axis, at least one pair of conductive thin plates have a symmetrical shape with respect to an x-y plane and a y-z plane, and the conductive thin plates, each facing to each other, are placed in a symmetrical position with respect to an x-z plane and have a symmetrical shape with respect to an x-z plane. An electric current distribution on conductive thin plates is symmetrical with respect to an x-z plane and each electric current in conductive thin plates flow in an opposite direction to each other.

7 Claims, 8 Drawing Sheets

COIL FOR GENERATING GRADIENT MAGNETIC FIELD

BACKGROUND OF THE INVENTION

1. Field of the Invention

The present invention relates to a gradient magnetic field coil for defining a tomographic plane in a magnetic resonance imaging (MRI) apparatus which is used for medical diagnosis by means of generating a computed tomography using nuclear magnetic resonance phenomena.

2. Description of the Prior Art

FIG. 1 is a perspective schematic view representing a principle of a conventional gradient magnetic coil where four saddle-type encircling coils are placed in symmetrical positions. In FIG. 1, a gradient magnetic coil 10 is composed of four saddle-type encircling coils 11, 12, 13, and 14. In the case of defining the origin O to be the center of a uniform static magnetic field and defining the x axis, the y axis and the z axis to be shown in FIG. 1, the saddle-type encircling coil 11 is composed of circular arc parts 111 and 113 which are placed along the cylindrical surface formed to be symmetrical with respect to the z axis and two straight parts 112 connected to circular arc parts 111 and 113, and an electric current flows in the direction depicted by arrows in the figure. The saddle-type encircling coil 12 is composed of two circular arc parts 121 and 123 and two straight parts 122 connected to these circular arc parts 121 and 123, and its configuration, layout and current flow direction are symmetrical to those of the saddle-type encircling coil 11 with respect to the z-x plane which is defined by the z axis and the x axis. Saddle-type encircling coils 13 and 14 are symmetrical to saddle-type encircling coils 11 and 12 with respect to x-y plane which is defined by the x axis and the y axis, respectively. As for electric current direction, for example, electric current directions in two circular arc parts 111 and 131 are identical to each other and electric current directions in circular arc parts 121 and 141 are identical to each other. Each electric current in circular arc parts 111, 131, 121 and 141 directs from the front side to the back side in FIG. 1, and circular arc parts 111, 131, 121 and 141 mainly establish a gradient magnetic field by superpositioning magnetic fields generated by them onto a uniform magnetic field in the neighboring area of the origin O. The gradient magnetic field coil 10 of FIG. 1 is a y-direction gradient magnetic field coil which generates a gradient magnetic field the z-direction component of which is proportional to a displacement in the y axis direction. Since a gradient magnetic field to be formed with a gradient magnetic field coil as shown in FIG. 1, which comprises only a set of saddle-type encircling coils 11, 12, 13 and 14, does not have good linearity characteristics of magnetic field to be required for practical MRI apparatus, it is commonly practiced that an actual gradient magnetic coil is composed of a plurality of sets of saddle-type coils.

FIG. 2 is a perspective schematic view of a gradient magnetic field coil composed of three sets of saddle-type encircling coils (Japanese Patent application Laying-open No. 229808/1987). In FIG. 2, a gradient magnetic field coil is composed of three sets 1, 2, and 3 of saddle-type encircling coils, each set being formed in a determined size and shape and placed at a determined position optimized by numerical calculations in order to generate a magnetic field having good linearity characteristics. Defining l1 to be a distance between the x-y plane and the circular arc part 111 of a saddle-type encircling coil 1 which part is placed adjacent to the x-y plane, defining l2 to be a distance between the x-y plane and the circular arc part 211 of a saddle-type encircling coil 2, and defining l3 to be distance between the x-y plane and the circular arc part 311 of a saddle-type encircling coil 3, distances l1, l2, and l3 are taken to be different values as shown in FIG. 2. The length of the circular arc part 111 (131) is the longest, the length of the circular arc part 311 (331) is intermediate, and the length of the circular arc part 211 (231) is the shortest. Each distance l1, l2 and l3 and each length of circular arc parts are determined by numerical calculations in order to optimize the gradient magnetic field linearity. By this way, an error of obtained gradient magnetic field linearity against ideal one is within at most several percent. In FIG. 2, as circular arc parts 131, 231 and 331 have a little influence on generating a gradient magnetic field, these parts are placed at the same position in the z axis. Each circular arc part of saddle-type encircling coil sets 1, 2 and 3 has almost the same size in its radius of curvature and all of these coils are mounted on a common frame.

As for a method for forming a gradient magnetic field coil by combining a plurality of sets of saddle-type encircling coils, these is another method using a larger number of saddle-type encircling coils as found in Japanese Patent application Laying-open No. 147450/1988 as well as aforementioned gradient magnetic field coil composed of three sets of saddle-type encircling coils which is disclosed in Japanese Patent Application Laying-open No. 229808/1987.

In aforementioned gradient magnetic field coils composed of a plurality of sets of saddle-type encircling coils, a set of saddle-type encircling coils composed of four saddle-type encircling coils placed symmetrical with respect to the x-y, y-z and z-x planes forms a primitive unit of coil equivalent to a one-turn coil. In case of forming a gradient magnetic field coil by combining a plurality of sets of this kind of saddle-type encircling coils, its ampere-turn is estimated to be a multiplication of the number of sets of saddle-type encircling coils to be used and an ampere-turn of each saddle-type encircling coil. An inductance of coils increases in proportion to the square of the number of turns of coils. As described above, a configuration of a gradient magnetic field coil by combining a plurality of sets of saddle-type encircling coils is aimed to generate a gradient magnetic field having a good linearity. In order to realize this configuration, it is required to use a set of saddle-type encircling coils, each coil having circular arc parts which are placed far from the x-y plane like a set 3 of saddle-type encircling coils as shown in FIG. 2. As these is a fact that the intensity of gradient magnetic field is getting larger as circular arc parts 111, 211 and 311 come closer to the x-y plane, the configuration of a set 3 of saddle-type encircling coils may not contribute to increasing the intensity of gradient magnetic field while this configuration mainly contributes to increasing the linearity in gradient magnetic field. So far, in the coil configuration as described above, there is a problem that the rate of increase of the strength of gradient magnetic field to the ampere-turn gets lower even if the number of turns of coils is increased in order to increase the linearity in gradient magnetic field.

SUMMARY OF THE INVENTION

An object of the present invention is to provide a gradient magnetic field coil with a high linearity of gradient magnetic field and a higher efficiency in generating a high intensity gradient magnetic field by using coils with the smaller number of ampere-turns.

The present invention provides a gradient magnetic field coil for generating a magnetic field in a determined direction and superpositioning the magnetic field onto a uniform magnetic field comprising:

at least one pair of conductive thin plates, each plate being placed on a surface of a common cylinder and facing to each other on both sides of a plane including a central axis of the cylinder; and a plurality of rod conductors for supplying an electric current to the at least one pair of conductive thin plates wherein in case of defining a body center of the cylinder to be an origin, defining a central axis of the cylinder to be a z axis, defining an axis included in the plane, intersecting the z axis at the origin and being vertical to the z axis to be an x axis and defining an axis intersecting the z axis the origin and being vertical to the x axis and z axis to be a y axis;

the at least one pair of conductive thin plates have a symmetrical shape with respect to an x-y plane and a y-z plane;

the conductive thin plates, each facing to each other, are placed in a symmetrical position with respect to an x-z plane;

the at least one pair of conductive thin plates and the rod conductors are connected so that an electric current distribution on the conductive thin plates, each facing to each other, may be symmetrical with respect to the x-z plane and the each electric current in the conductive thin plates may flow in an opposite direction to each other.

Here, each developed shape of the at least one pair of conductive thin plates may be a rectangular and an electric current input/output ports for supplying and extracting an electric current is placed at a center of each edge of the conductive thin plates, each edge being parallel to the z axis.

Each developed shape of the at least one pair of conductive thin plates may be a square.

At least one slit may be formed in a circumferential direction on each of at least one pair of conductive thin plates.

Each developed shape of the at least one pair of conductive thin plates may be a rectangular, each of the conductive thin plates has a first conductive thin plate and a second conductive thin plate and an insulating material layer inserted between them;

an electric current flows from one corner to another diagonal corner in each of the first conductive thin plate and the second conductive thin plate; and the first and second conductive thin plates are connected by the rod conductor so that a circumferential component of an electric current in the first and second conductive thin plates may flow in an identical direction and a z direction component of an electric current in the first and second conductive thin plates may flow in an opposite direction.

Each developed shape of the at least one pair of conductive thin plates may be a square.

At least one slit may be formed in a circumferential direction on each of at lest one pair of conductive thin plates.

In the present invention, a symmetrical property required for gradient magnetic field formed by a gradient magnetic field coil is established by means of forming a gradient magnetic field with at least one pair of conductive thin plates. These plates are placed on a cylinder with its symmetrical axis on the z axis so as to be symmetrical to each other with respect to the z-x plane and by means of making the shape and configuration of conductive thin plates being symmetrical with respect to each of z-x, z-y and y-x planes, respectively, and by means of connecting conducting thin plates so that electric current flows in a symmetrical manner with respect to the y-z plane and in the counter direction. Major electric current components which contribute to generating an effective gradient magnetic field are in the circumferential direction on conductive thin plates shaped in a cylindrical surface, and as these electric current components are also found in the neighbor of the origin O and on the x-y plane, and a high efficiency in generating gradient magnetic field is obtained. It is allowed to use coils with the lower number of ampere-turns in order to obtain a desired magnetic field intensity. As the electric current flows in conductive thin plates widely in the z direction and the electric current distribution is similar to that in coils formed by a plurality of sets of conventional saddle-type coils, a good linearity in gradient magnetic field may be obtained even if a gradient magnetic coil is composed of a primitive unit with a single turn of coils. The size and configuration of coils in a practical use are obtained by iterative numerical calculations based on the developed shape of conductive thin plates, the width and length of rectangular shape of each plate, positions of electric current input/output ports on each plate and the layout of rod conductors connecting conductive thin plates at input/output ports.

In the case of forming the developed shape of conductive thin plates in a rectangular and placing a pair of the current input/output ports on each plate at the center of each edge parallel to the z axis, the electric current distribution on each conductive thin plate is symmetrical with respect to the line connecting two input/output ports and the circumferential electric current component takes its maximum peak on this line and furthermore, the electric current density decreases toward side end from the origin O in the z direction. In addition, as the line connecting two input/output ports is placed on the x-y plane, the electric current distribution described above is also symmetrical with respect to the x-y plane. So far, as the circumferential electric current component takes its maximum peak on the x-y plane, a highly efficient generation of gradient magnetic field may be attained.

In the case that the developed shape of conductive thin plates is taken to be a rectangular and that two conductive thin plates and insulating material between them are formed together, and further that defining four corners of conductive plates by A, B, C and D, sequentially around the peripheral edges of the plate, electric current is fed on one conductive thin plate from an input port at A through an output port at C and electric current is fed on another conductive thin plate from an input port at B through an output port at D, electric current components which are not symmetrical with respect to both of the z-x plane and the x-y plane are compensated by each other and the net gradient magnetic field is formed to be symmetrical with respect to both of the z-x plane and the x-y plane. By means of connecting two layered conductive thin plates, between which insulating material is inserted, in a series circuitry and making the electric current flowing in each conductive thin plate identical to each other, aforementioned electric current components which is not symmetrical with respect to both of the z-x plane and the x-y plane are compensated more exactly. In this case, the electric current density at the center of conductive thin plates is estimated to be larger than that at each end of the plates in the z direction by means of numerical calculation and gradient magnetic field having better linearity can be obtained in comparison with the previous case that input/output ports are placed on the center of edges on conductive thin plates.

In practice of the present invention, by means of optimizing the square shape and edge size of conductive thin plates and adjusting the distance between rod conductors for connecting conductive thin plates at input-/output ports and conductive thin plates, it will be appreciated that manufacturing process of materials used for conductive thin plates can be facilitated and that reduction of the amount of wasted material may be attained by means of reasonable material processing and handling.

And furthermore, in the case of making more than one slits in the circumferential direction on conductive thin plates, electric current components in the circumferential direction are increased on a highly efficient generation of gradient magnetic field is attained, and in adjusting electric current distribution by means of selecting adequate values for the number of slits and the length of slits, a gradient magnetic field coil having a further qualified linearity can be established.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
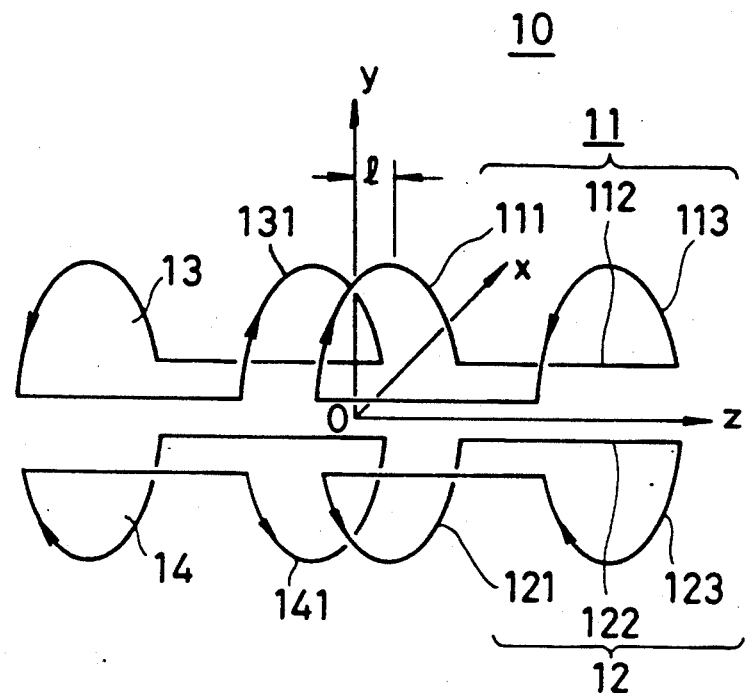
FIG. 1 is a perspective schematic view representing a principle of a conventional gradient magnetic field coil.
Figure 2:
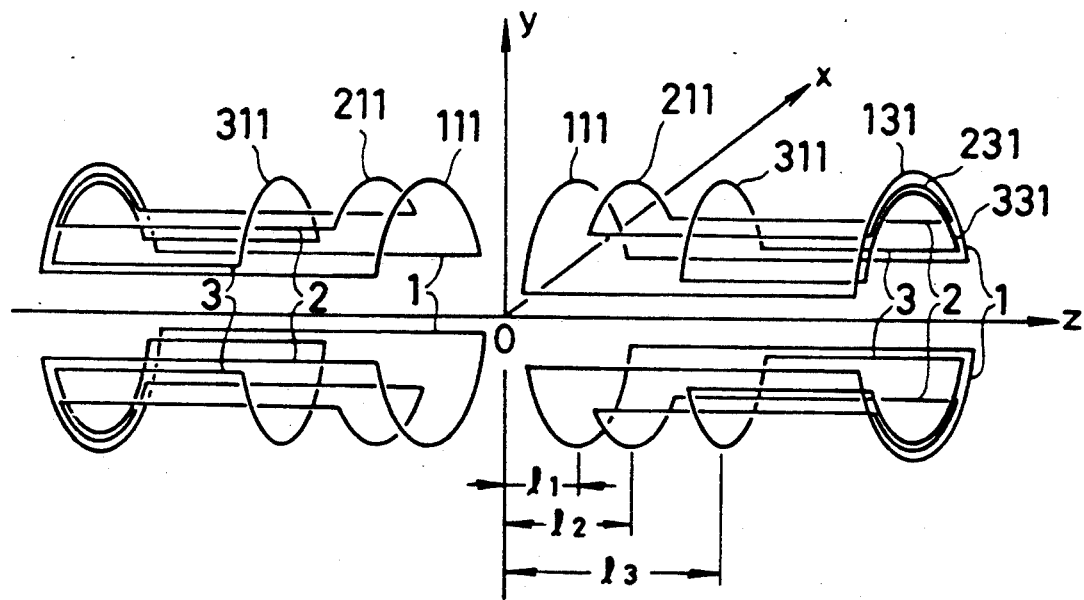
FIG. 2 is a perspective schematic view of another conventional gradient magnetic field coil composed of three sets of saddle-type encircling coils.
Figure 3:
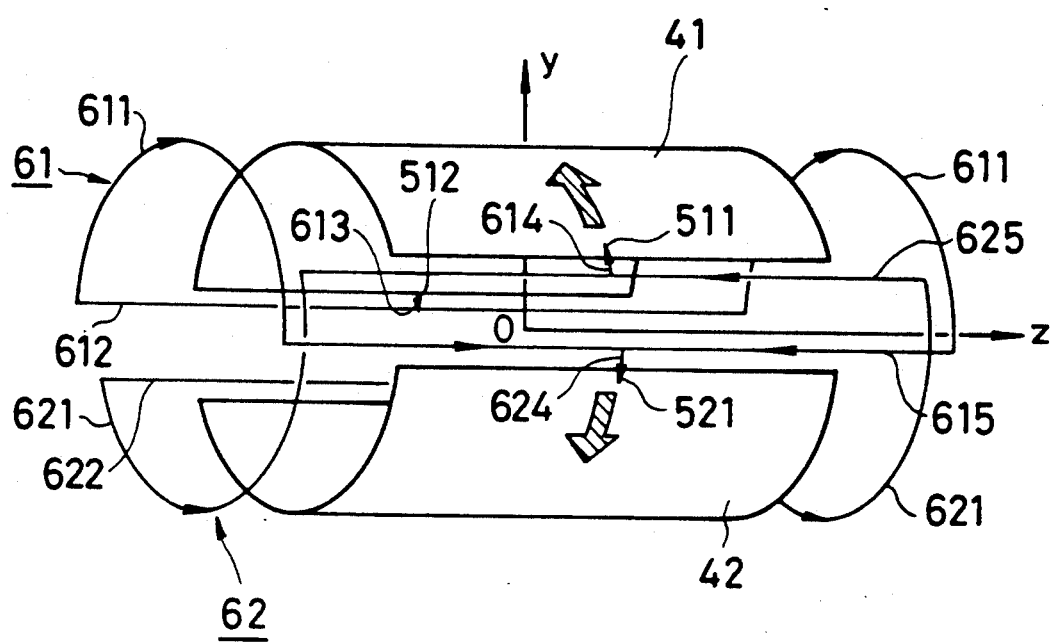
FIG. 3 is a perspective schematic view of a first embodiment a gradient magnetic field coil of the present invention.
Figure 4:
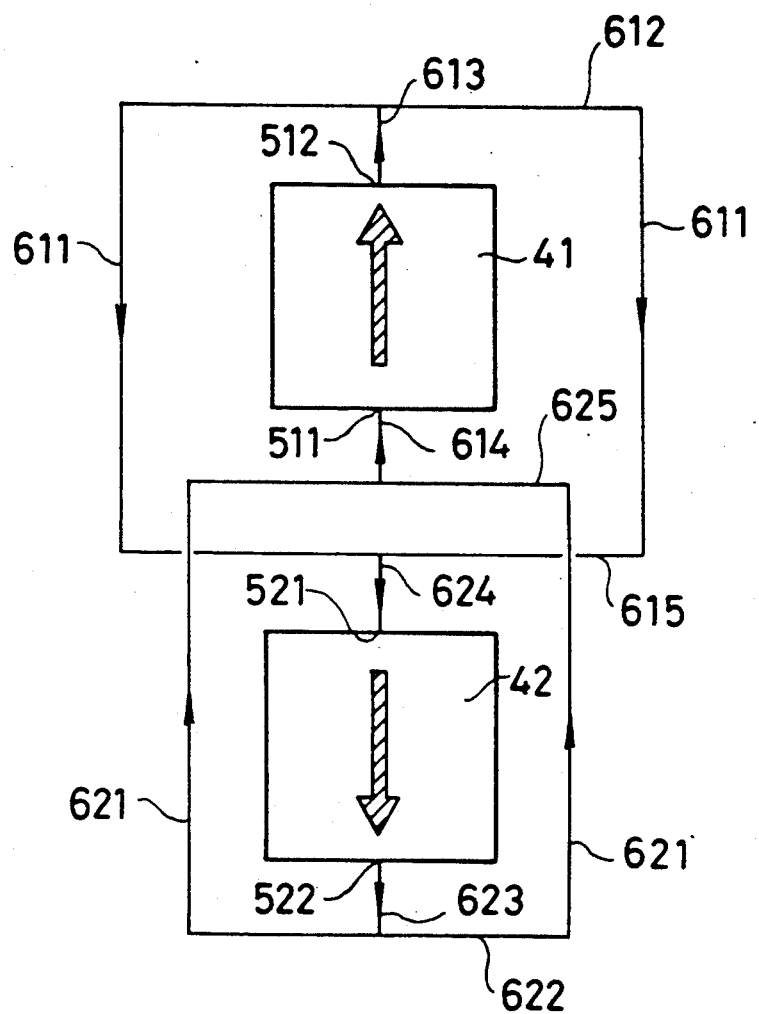
FIG. 4 is a developed plan view of the gradient magnetic field coil shown in FIG. 3.

Referring now to FIGS. 3 and 4, FIG. 3 is a perspective schematic view of a gradient magnetic coil in a first embodiment of the present invention, and FIG. 4 is a developed plane view of the gradient magnetic coil shown in FIG. 3.

In FIG. 3, an origin O is a center of a uniform magnetic field. Illustrated are a y axis lying in the upper direction from the origin O in the figure and a z axis lying in the right direction from the origin O, while an x axis lying in the vertical direction to the surface of the figure is not shown the x axis in FIG. 6 also will not be shown.

Conductive thin plates 41 and 42 made of, for example, copper or copper alloy are parts of a common cylindrical surface, each of which is placed in a symmetrical geometry with respect to an x-y plane and is placed separately in a symmetrical geometry with respect to a z-x plane and above and below the origin O, respectively. Conductive thin plates 41 and 42 are composed of an identical material or of materials with an identical electric resistance. An inner hollow cylindrical space formed by conductive thin plates 41 and 42 facing to each other is a space for accommodating a patient body. Saddle-type rod conductors 61 and 62 are placed along and neighboring edges of conductive thin plates 41 and 42, respectively. The saddle-type rod conductor 61 is composed of two circular are parts 611 and two straight parts 612 and 615 connected to each of two circular arc parts 611. The saddle-type rod conductor 62 is composed of two circular arc parts 621 and two straight parts 622 and 625 connected to each of two circular arc parts 621. The shape of saddle-type rod conductors 61 and 62 is symmetrical with respect to the x-y plane. An electric current input/output port 511 formed at the center of one edge of the conductive thin plate 41 parallel to the z axis is connected to the center of the straight part 625 of the rod conductor 62 through a rod conductor 614. An electric current input/output port 512 formed at the center of the other edge of the conductive thin plate 41 parallel to the z axis is connected to the center of the straight part 612 of the rod conductor 61 thorough a rod conductor 613. On the other hand, an electric current input/output port 512 formed at the center of one edge of the conductive thin plate 42 parallel to the z axis is connected to the center of the straight part 615 of the rod conductor 61 through a rod conductor 624, and an electric current input/output port 522 formed at the center of the other edge of the conductive thin plate 42 parallel to the z axis is connected to the center of the straight part 622 of the rod conductor 62 through a rod conductor 623. Electric currents in conductive thin plates 41 and 42 are set to be in an opposite direction to each other. In making input/output ports 511 and 521 of conductive thin plates 41 and 42 current inlet ports and making input/output ports 512 and 522 current outlet ports, hatched arrows shown in FIG. 4 show directions of electric currents in conductive thin plates 41 and 42, and simple arrows show directions of electric currents in rod conductors 61 and 62. And electric current starting from the rod conductor 625 flows through the rod conductor 614, the conductive thin plate 41, the rod conductor 613, the rod conductor 612, the rod conductor 611, the rod conductor 624, the conductive thin plate 42, the rod conductor 623, the rod conductor 622, the rod conductor 621 and goes back to the rod conductor 625.

Figure 5:
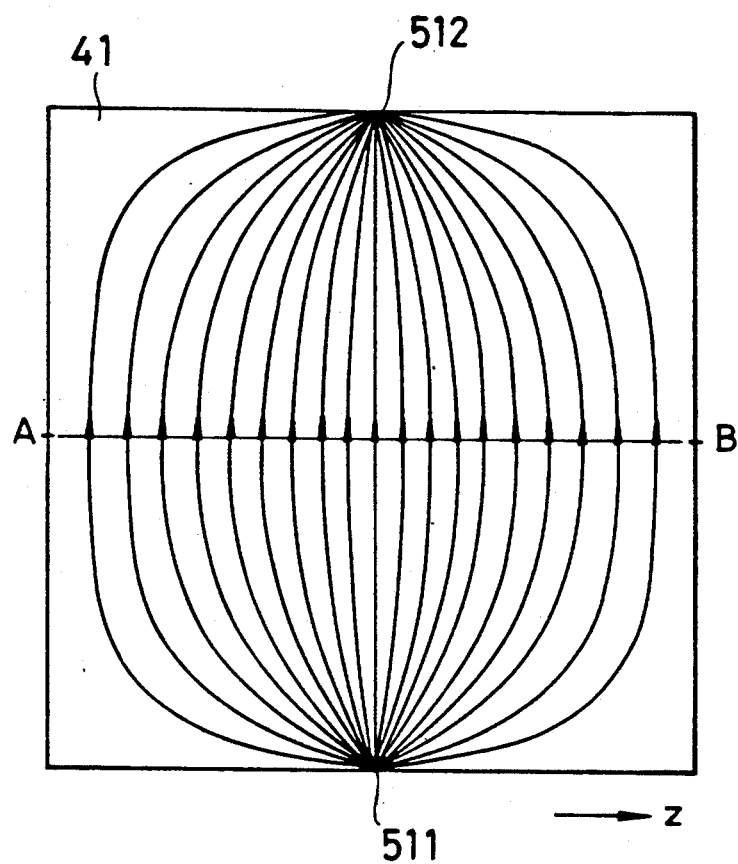
FIG. 5 is an electric current distribution diagram illustrating an electric current in a conductive thin plate shown in FIG. 4.

FIG. 5 is an electric current distribution diagram illustrating an electric current flowing in the conductive thin plate 41 shown in FIGS. 3 and 4. In FIG. 5, an electric current starting from the electric current input port 511 diffuses in the conductive thin plate 41 and after passing through the center of the plate the electric current converges into the electric current output port 512 and goes out of there. As the positions of electric current input and output ports 511 and 512 on the conductive thin plate 41 are set to be line and point symmetrical, the electric current distribution is symmetrical with respect to the center of the conductive thin plate 41 and the straight line connecting electric current input and output ports 511 and 512. The electric current density distribution along the line (A—B) passing through the center of the conductive thin plate and parallel to the edges has a maximum peak at the center of the plate while the electric current density getting smaller at each end of the line (A—B). The maximum electric current density measured at the center of the line (A—B) is 1.5 times as large as that measured at each end of the line (A—B), i.e., the current density ratio is 1.5. The current density ratio correlates with the aspect ratio of the rectangular shape of conductive thin plates. In the case shown by FIG. 5, where the developed shape of conductive thin plates 41 and 42 are square and the aspect ratio is 1; in case of a rectangular which has a longer edge in the direction along the line connecting the electric current input and output ports 511 and 512, the current density ratio is less than 1.5 and in case of a rectangular which has a shorter edge in the direction along the line connecting ports 511 and 512, the current density ratio is greater than 1.5. Though the current flow direction in the conductive thin plate 42 is opposite to that in the conductive thin plate 41, the electric current density distribution in both plates is identical to each other. As the electric current component in the neighbor of the x-y plane eventually contribute to generating the gradient magnetic field as described earlier, a characteristic that the electric current density in the conductive thin plate 42 (41) takes its maximum peak along the line connecting the current input/output port 511 (521) and the port 523 (522), i.e., in the area neighboring to the x-y plane shows a highly efficient generation of the gradient magnetic field.

Figure 6:
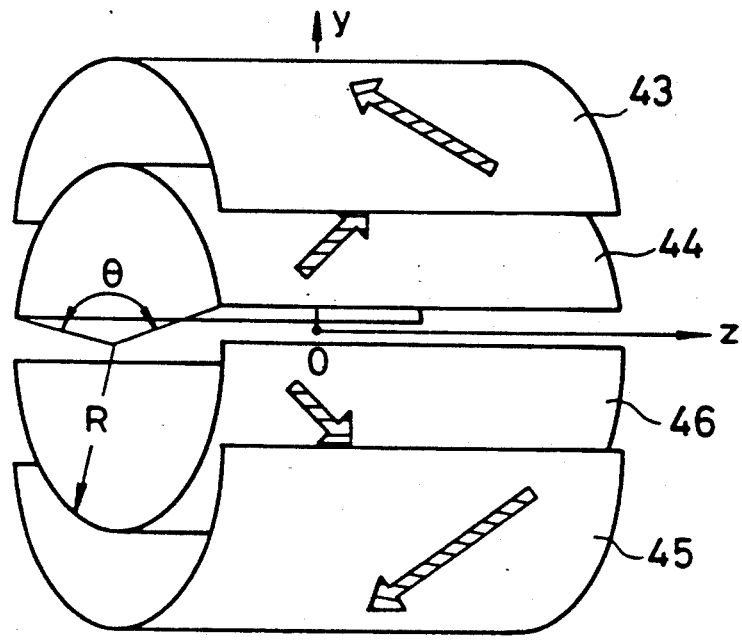
FIG. 6 is a perspective schematic view of a conductive thin plate showing a second embodiment of the present invention.

FIG. 6 is a perspective schematic view of a conductive thin plate showing a second embodiment of the present invention. Conductive thin plates 43, 44, 45 and 46 are shaped to be a part of a common cylindrical surface and are symmetrical with respect to the x-y plane. Conductive thin plates 43 and 45 are also symmetrical with respect to the x-z plane and also conductive thin plates 44 and 46 are also symmetrical with respect to the x-z plane. In FIG. 6, electric current input/output ports in conductive thin plates and rod conductors are not shown. All the conductive thin plates have an identical rectangular shape and are composed of an identical material or of material with an identical electric resistance. Layers made of an insulating material not shown in FIG. 6 are inserted between conductive thin plates 43 and 44 and between conductive thin plates 45 and 46, respectively.

Figure 7:
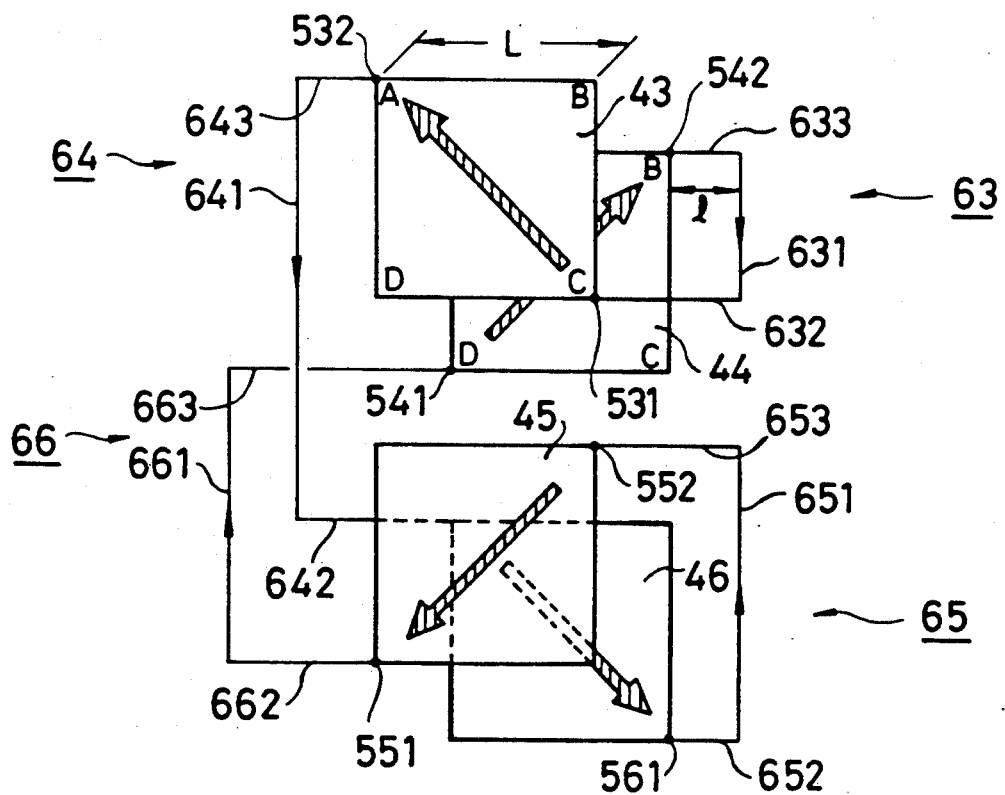
FIG. 7 is a developed plan view of a conductive thin plate shown in FIG. 6 containing a rod conductor.

FIG. 7 is a developed plan view of the conductive thin plate shown in FIG. 6 where shown are wirings of rod conductors, relative positions of electric current input/output ports on conductive thin plates and connections between rod conductors and conductive thin plates. The conductive thin plates 43 and 44 and laminated and the conductive thin plates 45 and 46 are also laminated. In FIG. 7, spatial gaps between conductive thin plates 43 and 44 and between conductive thin plates 45 and 46 are depicted in a magnified view. The thickness of these spatial gaps is about 1 mm to be determined in accordance with the thickness of the insulating material layer inserted in gaps. In FIG. 6, for explanation of electric current directions in this configuration of conductive thin plates and electric current input/output ports, a pair of conductive thin plates are shown in biased positions. In a practiced coil, corresponding four corners of each of a pair of conductive thin plates are exactly overlapped.

Rod conductors 63, 64, 65 and 66 for supplying electric current into conductive thin plates 43, 44 45 and 46 are arranged along an imaginary cylindrical surface on which these conductive thin plates are placed. The rod conductor 63 is composed of a circular arc part 631, two straight parts 632 and 633; the rod conductor 64 is composed of a circular arc part 641 and two straight parts 642 and 643; the rod conductor 65 is composed of a circular arc part 651 and two straight parts 652 and 653; and the rod conductor 66 is composed of a circular arc part 661 and two straight parts 662 and 663.

In the embodiment shown in FIG. 7, an electric current starting from the rod conductor 63 flows through the conductive thin plate 43, the rod conductor 64, the conductive thin plate 46, the rod conductor 65, the conductive thin plate 45, the rod conductor 66, the conductive thin plate 44 and goes back to the rod conductor 63.

As a pair of conductive thin plates 43 and 44 has the same shape, structure and current density as those of a pair of conductive thin plates 45 and 46, only the embodiment for conductive thin plate 43 and 44 are described in the followings. Four corners of conductive thin plates 43 and 44 are labeled by A, B, C and D in a clockwise manner around the peripheral edges on the plates as shown in FIG. 7. Such a labelling as shown in FIG. 7 with A, B, C and D does not bring any loss of generality for in the further explanation of the embodiment of the present invention.

As shown in FIG. 7, electric current input/output ports of the conductive thin plate 43 are provided at the corner 532 and at the opposite corner 531 of the conductive thin plate 43, and electric current flows into conductive thin plate 43 from the input port 531 and flows out from the output port 532. Thus, electric current in the conductive thin plate 43 flows diagonally. In the conductive thin plate 44, electric current flows into the thin plate 44 from the input port 541 and flows out from the output port 542. As described before, because conductive thin plates 43 and 44 are overlapped and the spatial gap between them is kept to be a very small value, electric current components in the direction along the edge AB (or CD) on both the conductive thin plates 43 an 44 are compensated and the net electric current is considered to direct from the center of the edge DC to the center of the edge AB on the conductive thin plates 43 and 44. In other words, though electric current distribution on each conductive thin plate is not symmetrical with respect to the line connecting the center of the edge DC and the center of the edge AB, the net current distribution formed by a configuration of two conductive thin plates 43 and 44 is symmetrical. So far, owing to the aforementioned symmetry in electric current distribution, the same kind of symmetry in the gradient magnetic field distribution generated by above mentioned electric current distribution is guaranteed.

Figure 8:
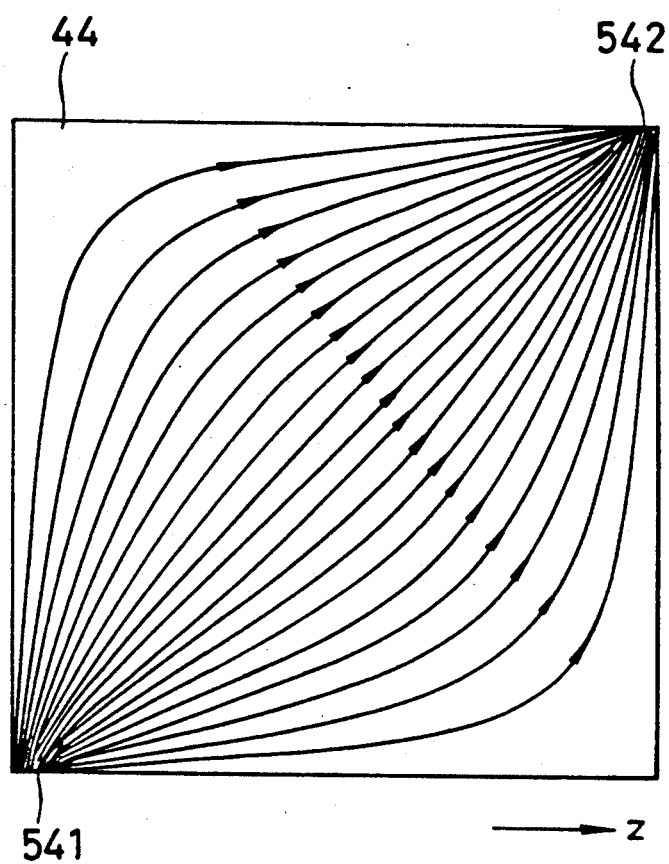
FIG. 8 is an electric current distribution diagram illustrating an electric current in a conductive thin plate shown in FIG. 6 and FIG. 7.

FIG. 8 is an electric current distribution on the conductive thin plate 44 shown in FIGS. 6 and 7. A vertical line in FIG. 8 corresponds to the circumferential direction on the conductive thin plate shown in FIG. 6 and a horizontal line in FIG. 8 corresponds to the z axis direction. An electric current flows into the conductive thin plate from an electric current input port 541 and diffuses towards the center of the plate, and after passing through the center of the plate, the electric current converged into an electric current output port 542 and flows out from the port 542. As the input and output ports 541 and 542 are placed at diagonal corners on the plate, the electric current distribution is unsymmetrical with respect to the vertical line and the horizontal line of FIG. 8. The electric current component in the vertical direction on the conductive thin plate which generates a gradient magnetic field is estimated to be smaller on the center of the plate and to be greater on both side edges of the plate. This characteristic of the electric current density distribution is in an opposite relation to that of the electric current density distribution given by the conductive thin plate shown in FIG. 5. The ratio of the electric current density measured at the center of the plate to the electric current density measured at both side ends of the plate is reciprocals of the ratio referring to the conductive thin plate 41, i.e., 1/1.5. This ratio occurs in case that the conductive thin plate 44 is a right square. In case of a rectangular having its vertical edge longer than its horizontal edge is, the ratio comes close to 1.0, in case of a rectangular having its vertical edge longer than its vertical edge, the ratio gets to less than 1/1.5.

As the electric current distribution on the conductive thin plate 45 is symmetrical to that on the plate 44 shown in FIG. 8 with respect to their vertical line, the net electric currant distribution formed by combining and superpositioning plates 44 and 45 is considered to be symmetrical with respect to the horizontal line and the vertical line of the plates because the electric current components in the horizontal direction are compensated to be zero and only the electric current components in the vertical direction contribute to form the net electric current distribution. As the amount of the net electric current components in the vertical direction is the sum of the electric current in the plates 44 and 45 in the vertical direction, the net ratio of the electric current density in the center of the plate to that in the both side ends of the plate is maintained to be 1/1.5, and the intensity of the gradient magnetic field generated by a combination of the plates 44 and 45 is two times as large as that of the gradient magnetic field generated by a single plate. So far, even if a couple of electrodes are placed at diagonal corners on the plate and the electric current is made to flow in the diagonal direction, the efficiency in generating a gradient magnetic field is not extremely made to be worse.

In FIG. 7, as described above, rod conductors 631, 641, 651 and 661 are circular arc parts, and rod conductors 632, 633, 642, 643, 652, 653, 662 and 663 are straight parts parallel to the z axis. The layout of circular arc rods 631, 641, 651 and 661 is similar to that of rod conductors 611 and 621 in FIG. 3, rod conductors 631 and 641 are shaped in a convex form toward the upper direction like the rod conductor 611, while rod conductors 651 and 661 are shaped in a convex form toward the under direction like the rod conductor 621 shown in FIG. 3. Being different from straight rod conductors extended in the z axis in FIG. 7 are not extended along the overall gradient magnetic field coil, and therefore, circumferential gap between two plate sets 43, 44 and 45, 46 can be set to be an arbitrarily small value so as to attain a flexibility in apparatus design.

As described above, in the second embodiment of the present invention, an electric current density at the center of the conductive thin plate 44 is smaller than that at each side end of the plate. The intensity of a gradient magnetic field generated by an apparatus with the second embodiment is less than that generated by an apparatus with the first embodiment in using an identical ampere-turns per unit length of coil. However, it is proven by carrying out a numerical calculation for estimating linearity of a gradient magnetic field that the apparatus with the second embodiment gives better linearity than the apparatus with the first embodiment.

Several computational results are shown in Table 1 in order to estimate conditions to give a good linearity in a gradient magnetic field with the second embodiment of the present invention. In Table 1, numerical errors in obtained intensity of the gradient magnetic field is about 2%. In Table 1, R denotes the radius of circular arc plates 44 and 46, $\Theta$ denotes a radial angle, l denotes a distance of the rod conductors 631 and 641 from an end edge of the conductive thin plate 44 and L denotes the length of a gradient magnetic field coil in the z axis, L is the optimum length where R, $\Theta$ and l are determined as values shown in the Table. With the length Lt of the gradient magnetic field coil in the z axis, $Lt=L+2l$. In every measured data, the number of turns of a coil made of two-layered conductive electrode is set to be 1, and the unit of length of mm and the unit of angle is degree, $Rl=R\Theta(\pi/180)$.

TABLE 1

| No. | R | l | $\Theta$ | L | LT | Rl/L |
|---|---|---|---|---|---|---|
| 1 | 450 | 0 | 170 | 1361 | 1361 | 0.981 |
| 2 | 450 | 100 | 170 | 1163 | 1363 | 1.148 |
| 3 | 450 | 100 | 160 | 1163 | 1363 | 1.099 |

As found from comparison between No. 1 and No. 2 data in Table 1, changes in l make no difference in Lt, the overall length of the gradient magnetic field coil. As the aspect ratio of the conductive thin plate in No. 1 case, Rl/L, is less than 1, the aspect ratio of the conductive thin plate in No. 2 case is greater than 1 and both values are very closer to 1, there is a condition under which Rl/L can be 1.0 with an appropriate value for l so that the developed shape of the conductive thin plates may be a right square. On the other hand, in case of making l less than 0, i.e., rod conductor 631 being placed over the conductive thin plates 43 and 44, the case is not practically useful because L is much greater than the values shown in Table 1. By comparing No. 2 No. 3 data in Table 1, it is appreciated that small deviation in $\Theta$ has little influence on L.

Electric current distributions shown in FIG. 5 and FIG. 8 are obtained by numerical calculation based on the assumption that the developed shape of the conductive thin plates 31 and 44 is a square. However, within the spirit of the present invention, the shape of conductive thin plates is not limited to be a square but is allowed to be a rectangular with an arbitrary aspect ratio and even to be a rectangular with its corners reshaped where electric current density is smaller. Specifically, in case of using square conductive thin plates, owing to point and line symmetricity of the plates, it is appreciated that manufacturing process of gradient magnetic field coils can be simplified and shaping process of materials used for conductive thin plates can be facilitated in order to reduce the amount of wasted materials.

Figure 9:
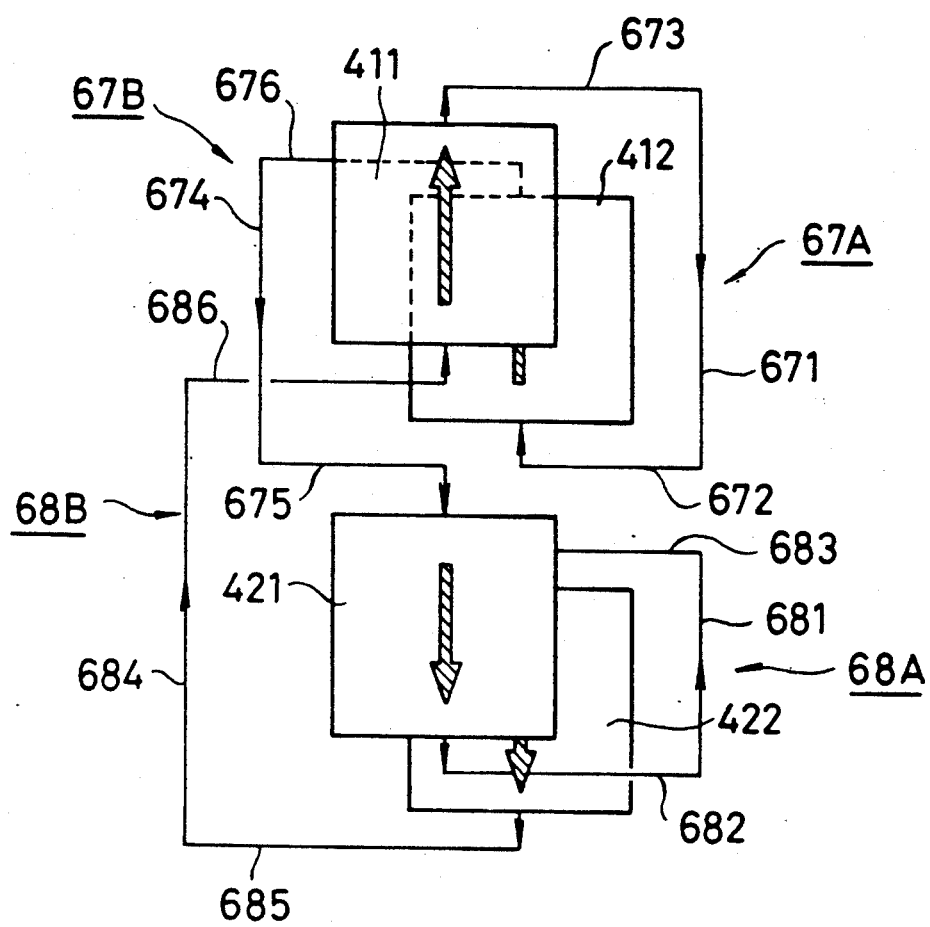
FIG. 9 is a developed plan view of a third embodiment of the gradient magnetic field coil of the present invention.

FIG. 9 is a developed plan view of a gradient magnetic coil in a third embodiment of the present invention. The gradient magnetic coil in FIG. 9 contains 2-turns coils while the gradient magnetic coil in the first embodiment contains 1-turn coils. In this embodiment of FIG. 9, conductive thin plates 411 and 412 are layered and formed as a series circuit by electric wiring. Conductive thin plates 421 and 422 are arranged and electrically connected in the same manner as those in plates 411 and 412. The layered structure of two conductive thin plates is basically similar to that with the second embodiment. In order to connect four conductive thin plates electrically, arranged together are a rod conductor 67A having a circular arc part 671 and straight parts 672 and 673, a rod conductor 67B having a circular arc part 674 and straight parts 675 and 676, a rod conductor 68A having a circular arc part 681 and straight parts 682 and 683, and a rod conductor 68B having a circular arc part 684 and straight parts 685 and 686. An electric current starting from the rod conductor 68B flows through the conductive thin plate 411, the rod conductor 67A, the conductive thin plate 412, the rod conductor 67B, the conductive thin plate 421, the rod conductor 68A, the conductive thin plate 422 and goes back to the rod conductor 68B.

In FIG. 9, circular arc parts 671, 674, 681 and 682 of rod conductors are placed at each side end of conductive thin plates and, as shown in FIG. 7, this layout is similar to that of rod conductors 611 and 621 in FIG. 3. By means of using 2-turn circuitry, coils with the third embodiment of the present invention have symmetrical configuration with respect to the z axis without employing such a parallel connection wiring between conductive plates as shown in FIGS. 3 and 4. This feature specific to the third embodiment does not exist in the first embodiment of the present invention. In the 2-turn circuitry, the voltage of the power supply to the coil is required to be two times as large as that in the 1-turn circuitry, and the current is half and therefore, the impedance of the coil is four times as large as that in the 1-turn circuitry. Selection of 1-turn circuitry or 2-turn circuitry depends on various technical aspects and specification for the coil.

Though there are shown an example of coils using 2-turn circuitry in FIG. 9, within the spirit of the present invention, 3-turn circuitry and 4-turn circuitry can be applicable. In case of using odd numbers of turns for coils, at least one turn circuitry is required to be formed with parallel connection wiring by rod conductors as shown in FIG. 3. It is possible to employ 2-turn circuitry in coils with the second embodiment where 1-turn circuitry is used. Though, in coils with the second embodiment, a pair of conductive thin plates are required to be superpositioned to each other in order to generate a symmetrical net current flow and the name "1-turn circuitry" comes from this configuration, the circuit structure of coils with the second embodiment can be interpreted as 2-turn circuitry because conductive thin plates 43, 44, 45 and 46 are connected in a series. In addition, there is no restriction in using conductive thin plates with different sizes for forming multiple turn circuitry, and hence it is possible to establish a gradient magnetic field coil having better linearity in its magnetic field by means of selecting optimum sizes of conductive thin plates.

Figure 10:
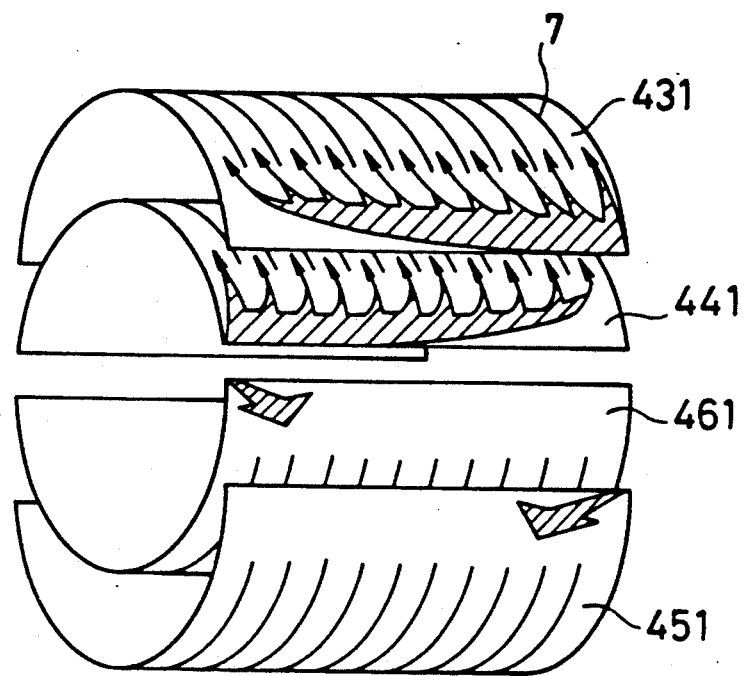
FIG. 10 is a perspective schematic view of a conductive thin plate in a forth embodiment of the present invention.

FIG. 10 is a perspective schematic view of a conductive thin plate of a forth embodiment of the present invention. In this embodiment, conductive thin plates 431, 441, 451 and 461 are formed by means of making slits 7 onto conductive thin plates 43, 44, 45 and 46 of the second embodiment shown in FIG. 6. Though the number of slits established in FIG. 10 is 10, the number is not restricted to 10. In FIG. 10, rod conductors for supplying electric currents to each conductive thin plates are not shown; non-illustrated rod conductors such as rod conductors 63, 64, 65 and 66 shown in FIG. 7 are arranged. And furthermore, insulating plates inserted between conductive thin plates 431 and 441 and between conductive thin plates 451 and 461 are not shown in FIG. 10. The electric current flows into the conductive thin plate 341 from the input port placed at the right corner on the front side edge and is distributed into each of slits 7. Owing to slits 7, the electric current component in the z axis, i.e., in the horizontal direction on FIG. 10, is reduced and the electric current component in the circumferential direction is increased. By means of altering the number of slits 7 and the length of slits 7 in order to adjust the electric current distribution on conductive thin plates, it is possible to form gradient magnetic field coils with desirable characteristics in magnetic field linearity by choosing an optimum slit configuration.

In the fourth embodiment, conductive thin plates with the second embodiment is used and slits are formed on them. It is possible to adjust the electric current distribution on conductive thin plates used in the first embodiment by means of forming slits on them, and therefore, it is possible to establish gradient magnetic field coils having desirable characteristics in the first embodiment by means of selecting an optimum configuration for slits on the plates. In addition, in gradient magnetic field coils of the third embodiment where multiple turn circuitry is used, it is possible to obtain the same effect as described above by means of forming slits on conductive thin plates in coils.

In the second embodiment, two conductive thin plates are overlapped on each other and two input/output ports are placed on two diagonal corners on each plate. It is also possible to use an input/output port layout where a single conductive thin plate is substituted for two layered plates and four input/output ports are placed at four corners on the plate in order to establish the same electric current distribution as that formed in conductive thin plates in the second embodiment. In this modification, it should be noted that a complete line and point symmetry is required with respect to four input/output port layout on the plate forming a parallel circuitry and that if this configuration is violated or material property is not uniform in components used in coils, the electric currant distribution may not have desired symmetry. As for factors arising nonuniform and unsymmetrical current distribution in a parallel circuitry, there may be manufacturing errors in gradient magnetic field coils as well as manufacturing errors in main coils for generating uniform magnetic fields, in other gradient magnetic field coils generating magnetic fields in other directions, in various magnetic field coils forming an MRI system such as antenna coils for emitting and receiving high frequency electromagnetic waves and also in supporting materials for these coils. Thus, in order to reduce unsymmetrical property in electric current distribution, it is desirable to employ a series circuitry for forming gradient magnetic field coils in stead of using a parallel circuitry. From the view point described above, in the second embodiment, two conductive thin plates are overlapped on each other and two input/output ports are placed on two diagonal corners on each plate in order to establish a net symmetrical electric current by combining two overlapped plates.

In another embodiment combining the first and second embodiments of the present embodiment, input/output ports on conductive thin plates are placed on edges parallel to the z axis between a corner and a center of the edge. In modifying the second embodiment, input/output ports are moved from corners of conductive thin plates to an appropriate position on edges parallel to the z axis. In modifying the first embodiment and allowing to form a parallel circuitry, each port which is originally placed at the center on an edge parallel to the z axis are divided into two individual ports to be placed on the edge to be closer to each side corner. Thus, combining the first embodiment and the second embodiment, gradient magnetic field coils to be obtained inherit advantageous aspects and disadvantageous aspects of coils with these embodiments. By adjusting the positions of input/output ports on conductive thin plates in modification of coils with the first and second embodiments and making the best use of advantageous aspects and reducing disadvantageous aspects, it is appreciated that gradient magnetic field coils with characteristics superior to those with these embodiments can be established.

And in another embodiment of the present invention, it may be allowed that in stead of forming an input/output port on a conductive thin plate as an electric contacting point, electric current is supplied and extracted through a conductive material contacted to the conductive thin plate and shaped in a bar or plate with its thickness greater than that of the conductive thin plate. In the case of using a conductive material contacted to the whole region of the edge of the conductive thin plate in the z axis, an electric current distribution in the conductive thin plate does not contain the current component in the z axis but contains only the current component in the circumferential direction. In this embodiment, the electric current distribution has an intermediate characteristic between characteristics with the first and the second embodiments; in the first embodiment, the electric current distribution has its maximum peak at the center of conductive thin plates and in the second embodiment, the electric current distribution has its maximum peak at each side edge of conductive thin plates. It is possible to use this electrode configuration by combining the third embodiment and the fourth embodiment. It should be noted that an input/output port configuration where the ports are placed at each side edge or cylinder circumferential edge is not practically valid because this port configuration reduces the electric current component in the circumferential direction which mainly contributes to generating an effective gradient magnetic field.

In the above embodiments, the developed shape of conductive thin plates are taken to be a rectangular. In order to reduce the weight of gradient magnetic field coils, it may be allowed to cut off the corners where the electric current density is smaller. In addition, by means of modifying the shape of conductive thin plates, it is possible to establish an optimum electric current distribution in conductive thin plates. Thus, the shape of conductive thin plates is not limited to a square or a rectangular within the spirit of the present invention.

The cross sectional shape of rod conductors is taken to be an arbitrary one. The name of "rod conductor" comes from the fact that the aspect ratio of the cross section of rod conductors is larger than the aspect ratio of the cross section of conductive thin plates, i.e., the ratio of the thickness to the width or length of conductive thin plates. As a gradient magnetic field coil is formed on a common frame, rod conductors which have a cross section with lower aspect ratio may be used in order to fit the circular arc shape of the common frame. The rod conductor includes a plate like conductor having a larger ratio of thickness to the width than that of the conductive thin plate.

As previously described, according to the present invention, a gradient magnetic field with a good linearity can be obtained. Therefore, as the size of gradient magnetic field coils can be reduced while a good linearity in a gradient magnetic field is guaranteed, it is appreciated that the coast and the weight of gradient magnetic field coils can be reduced.

As gradient magnetic field coils in the prior art have a structure where unsymmetricity in an electric current distribution is tried to be avoided by means of connecting each tern in a series, inductance of the coil increases in proportion to the square of the number of turns, which requires a high voltage power supply to the coil. This increase in inductance brings difficulties in fast switching and control of electric current power supplying.

On the other hand, in the present invention, as described above, desired characteristics in magnetic field linearity can be obtained even if gradient magnetic field coils are formed in one-turn or even two-turn configuration. Thus, according to the present invention, as an optimum adjustment of voltage and current supplying to gradient magnetic field coils can be facilitated by means of forming low inductance coils, it will be appreciated that fast switching and control of electric current power supplying is easily attained.

According to the present invention, it will be appreciated that manufacturing process of gradient magnetic field coils can be simplified and shaping process of materials used for conductive thin plates can be facilitated in order to reduce the amount of wasted materials, and that material cost can be reduced.

And furthermore, according to the present invention, it will be appreciated that owing to high efficiency in generating a gradient magnetic field, there required the less number of ampere-turns in coils for generating a high intensity gradient magnetic field and that the required power supply to coils may be smaller which leads to cost reduction and size reduction of power supply units.

The invention has been described in detail with respect to preferred embodiment, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A gradient magnetic field coil for generating a magnetic field in a determined direction and superpositioning said magnetic field onto a uniform magnetic field comprising:
   at least one pair of conductive thin plates, each plate being placed on a surface of a common cylinder and facing to each other on both sides of a plane including a central axis of said cylinder; and
   a plurality of rod conductors for supplying an electric current to said at least one pair of conductive thin plates wherein in case of defining a body center of said cylinder to be an origin, defining a central axis of said cylinder to be a z axis, defining an axis included in said plane, intersecting said z axis at said origin and being vertical to said z axis to be an x axis and defining an axis intersecting said z axis at said origin and being vertical to said x axis and z axis to be a y axis;
   said at least one pair of conductive thin plates have a symmetrical shape with respect to an x-y plane and a y-z plane;
   said conductive thin plates, each facing to each other, are placed in a symmetrical position with respect to an x-z plane;
   said at least one pair of conductive thin plates and said rod conductors are connected so that an electric current distribution on said conductive thin plates, each facing to each other, may be symmetrical with respect to the x-z plane and said each electric current in said conductive thin plates may flow in an opposite direction to each other.

2. A gradient magnetic field coil as claimed in claim 1, wherein each developed shape of said at least one pair of conductive thin plates is a rectangular and an electric current input/output ports for supplying and extracting an electric current is placed at a center of each edge of said conductive thin plates, each edge being parallel to said z axis.

3. A gradient magnetic field coil as claimed in claim 2, wherein each developed shape of said at least one pair of conductive thin plates is a square.

4. A gradient magnetic field coil as claimed in claim 2, wherein at least one slit is formed in a circumferential direction on each of at least one pair of conductive thin plates.

5. A gradient magnetic field coil as claimed in claim 2, wherein each developed shape of said at least one pair of conductive thin plates is a rectangular, each of said conductive thin plates has a first conductive thin plate and a second conductive thin plate and an insulating material layer inserted between them;
   an electric current flows from one corner to another diagonal corner in each of said first conductive thin plate and said second conductive thin plate; and
   said first and second conductive thin plates are connected by said rod conductor so that a circumferential component of an electric current in said first and second conductive thin plates may flow in an identical direction and a z direction component of an electric current in said first and second conductive thin plates may flow in an opposite direction.

6. A gradient magnetic field coil as claimed in claim 5, wherein each developed shape of said at least one pair of conductive thin plates is a square.

7. A gradient magnetic field coil of as claimed in claim 5, wherein at least one slit is formed in a circumferential direction on each of at lest one pair of conductive thin plates.

* * * * *